United States Patent
Khzouz et al.

(10) Patent No.: US 10,426,049 B2
(45) Date of Patent: Sep. 24, 2019

(54) ELECTRICAL ENCLOSURE INCLUDING A SELECTIVELY CLOSEABLE VENTILATION OPENING AND METHOD

(71) Applicant: ABB Schweiz AG, Baden (CH)

(72) Inventors: Erik Ryan Khzouz, Plainville, CT (US); Kevin Joseph Audibert, Morris, CT (US); Michael Paul Lafond, Wallingford, CT (US); Ganesh Venkataraman, Rocky Hill, CT (US)

(73) Assignee: ABB Schweiz AG, Baden (CH)

( * ) Notice: Subject to any disclaimer, the term of this patent is extended or adjusted under 35 U.S.C. 154(b) by 695 days.

(21) Appl. No.: 14/673,059

(22) Filed: Mar. 30, 2015

(65) Prior Publication Data

US 2016/0295718 A1    Oct. 6, 2016

(51) Int. Cl.
| | |
|---|---|
| *H05K 5/02* | (2006.01) |
| *H05K 5/03* | (2006.01) |
| *H02B 13/025* | (2006.01) |

(52) U.S. Cl.
CPC ......... *H05K 5/0213* (2013.01); *H02B 13/025* (2013.01); *H05K 5/0239* (2013.01); *H05K 5/03* (2013.01)

(58) Field of Classification Search
CPC .......... H02B 1/56; H02B 13/025; H05K 5/00; H01H 33/53
USPC ......... 454/184; 361/676, 605, 616; 218/155, 218/157; 174/50, 17 VA, 520; 200/306
See application file for complete search history.

(56) References Cited

U.S. PATENT DOCUMENTS

| | | |
|---|---|---|
| 2,770,701 A | 11/1956 | Yarrick |
| 4,158,757 A | 6/1979 | Reichert et al. |
| 5,493,474 A | 2/1996 | Schkrohowsky et al. |
| 5,574,624 A | 11/1996 | Rennie et al. |
| 5,689,097 A | 11/1997 | Aufermann et al. |
| 5,710,402 A | 1/1998 | Karnbach et al. |
| 5,934,115 A | 8/1999 | Bernier et al. |

(Continued)

FOREIGN PATENT DOCUMENTS

| | | |
|---|---|---|
| CN | 1801418 A | 7/2006 |
| CN | 104080295 A | 10/2014 |

(Continued)

OTHER PUBLICATIONS

European Search Report and Written Opinion issued in connection with corresponding European Application No. 16162655.1 dated Jun. 2, 2016.

(Continued)

*Primary Examiner* — Steven B McAllister
*Assistant Examiner* — Ko-Wei Lin
(74) *Attorney, Agent, or Firm* — Barnes & Thornburg LLP

(57) ABSTRACT

An electrical enclosure includes a plurality of walls. The electrical enclosure also includes at least one compartment defined, at least in part, by the plurality of walls, and at least one ventilation opening formed in one of the plurality of walls. The at least one ventilation opening provides a flow path from the at least one compartment. At least one closure is provided on the one of the plurality of walls at the at least one ventilation opening. The at least one closure is responsive to a pressure wave to selectively close the at least one ventilation opening and re-open the at least one ventilation opening after the pressure wave has passed from the electrical enclosure.

15 Claims, 6 Drawing Sheets

(56) References Cited

U.S. PATENT DOCUMENTS

| | | |
|---|---|---|
| 6,388,867 B1 | 5/2002 | Rakus et al. |
| 7,034,242 B1 | 4/2006 | Shea et al. |
| 7,054,143 B2 | 5/2006 | Eiselt et al. |
| 7,558,052 B1 | 7/2009 | Coomer et al. |
| 7,586,738 B1 | 9/2009 | Hartzel et al. |
| 7,732,727 B2 | 6/2010 | Saxl et al. |
| 7,821,774 B2 | 10/2010 | Josten et al. |
| 7,871,137 B2 | 1/2011 | Schulz et al. |
| 7,952,042 B2 | 5/2011 | Coomer et al. |
| 7,952,857 B1 | 5/2011 | Motley et al. |
| 8,101,881 B2 | 1/2012 | Miller et al. |
| 2006/0067018 A1* | 3/2006 | Malkowski, Jr. ...... H02B 11/04 361/2 |
| 2012/0028559 A1* | 2/2012 | Kingston ............. H05K 5/0213 454/184 |
| 2013/0320831 A1* | 12/2013 | Schmidt ............... H02B 13/025 312/296 |
| 2014/0110232 A1* | 4/2014 | Gingrich ................ H01H 33/53 200/306 |
| 2015/0036310 A1 | 2/2015 | Karandikar et al. |
| 2015/0133042 A1* | 5/2015 | Pearce ................. H02B 13/025 454/184 |

FOREIGN PATENT DOCUMENTS

| | | |
|---|---|---|
| DE | 7141970 U | 4/1972 |
| DE | 2462074 A1 | 11/1975 |
| EP | 0387973 A1 | 9/1990 |
| EP | 0478432 A1 | 4/1992 |
| EP | 1650496 A2 | 4/2006 |
| WO | 2014188557 A1 | 11/2014 |

OTHER PUBLICATIONS

Eaton, "Door escutcheon with gasket for Magnum low voltage circuit breakers", Instructional Leaflet IL2C12999H01, Jan. 2010, pp. 1-2.

China National Intellectual Property Administration, First Office Action for CN 201610191711.0, dated Jun. 4, 2019, 15 pages (including English translation).

* cited by examiner

ELECTRICAL ENCLOSURE INCLUDING A SELECTIVELY CLOSEABLE VENTILATION OPENING AND METHOD

BACKGROUND OF THE INVENTION

The subject matter disclosed herein relates to the art of electrical enclosures and, more particularly, to an electrical enclosure having a selectively closeable ventilation opening.

Electrical enclosures house a variety of electrical components including circuit breakers, bus bars, control equipment, and the like. Typically, an electrical enclosure includes a line portion that houses bus bars and the like, and a load portion. The load portion may take the form of one or more circuit breaker compartments that may house circuit breakers, and one or more auxiliary compartments that may house control components and the like. In addition to being exposed to over current conditions, many circuit breakers may also be exposed to an arc fault. During an arc fault event, gases are often generated in the load portion or circuit breaker compartments. Gases may also be generated in the line portion. It is desirable to guide the gases from the electrical enclosure along a selected pathway.

BRIEF DESCRIPTION OF THE INVENTION

According to one aspect of an exemplary embodiment, an electrical enclosure includes a plurality of walls. The electrical enclosure also includes at least one compartment defined, at least in part, by the plurality of walls, and at least one ventilation opening formed in one of the plurality of walls. The at least one ventilation opening provides a flow path from the at least one compartment. At least one closure is provided on the one of the plurality of walls at the at least one ventilation opening. The at least one closure is responsive to a pressure wave to selectively close the at least one ventilation opening and re-open the at least one ventilation opening after the pressure wave has passed from the electrical enclosure.

According to another aspect of an exemplary embodiment, a method of ventilating an electrical enclosure including a plurality of walls that define, at least in part, at least one compartment, includes passing gases from the at least one compartment through at least one ventilation opening, closing the at least one ventilation opening with at least one closure in response to a pressure wave in the at least one compartment, and re-opening the at least one ventilation passage after a substantial portion of the pressure wave has passed from the at least one compartment.

These and other advantages and features will become more apparent from the following description taken in conjunction with the drawings.

BRIEF DESCRIPTION OF DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
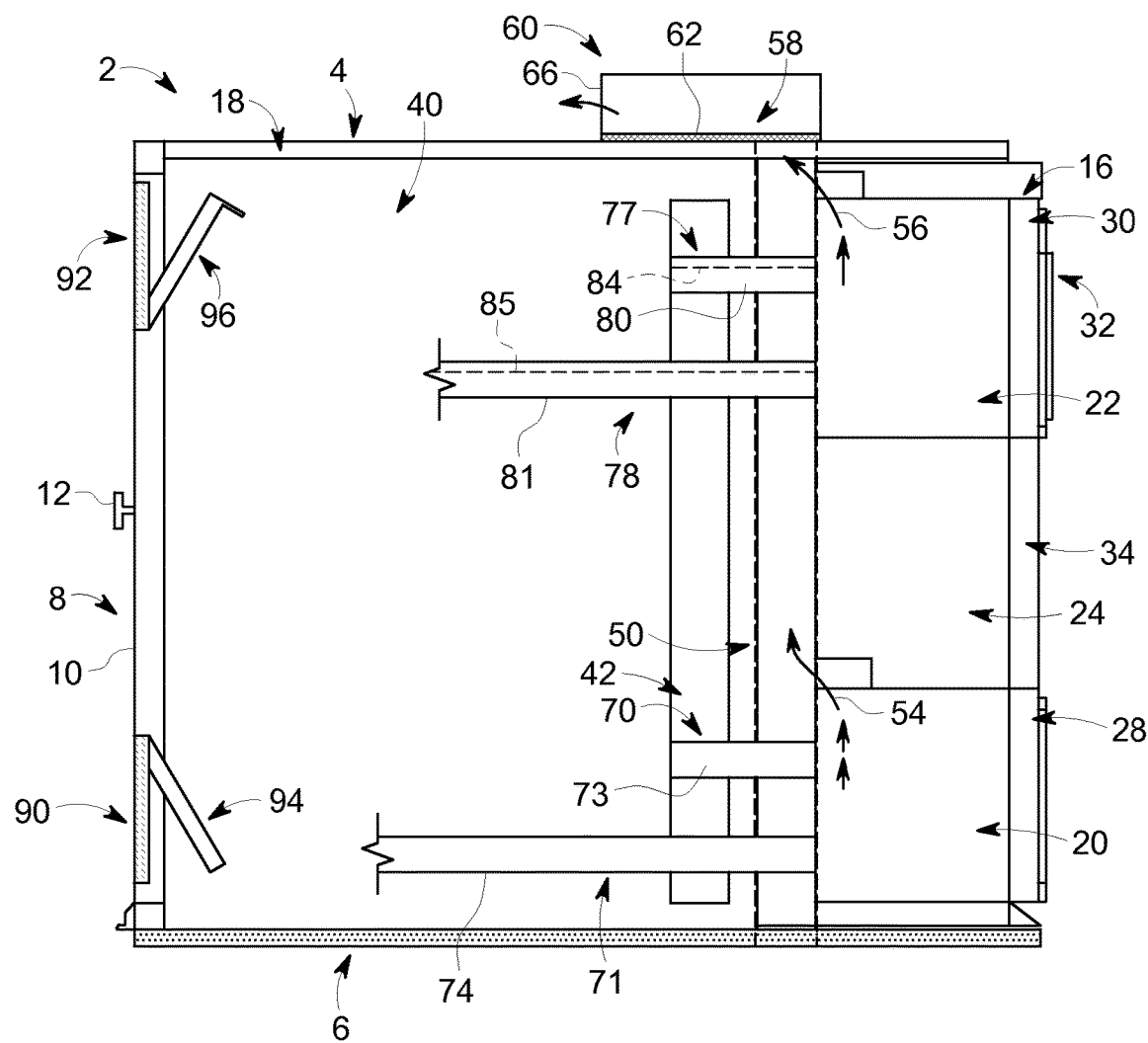
FIG. 1 depicts an electrical enclosure including a circuit breaker portion, a line portion, and a selectively closeable ventilation opening, in accordance with an exemplary embodiment.

An electrical enclosure, in accordance with an exemplary embodiment, is illustrated generally at 2, in FIG. 1. Electrical enclosure 2 includes a plurality of walls including a first wall 4, a second wall 6, and a third wall 8. In the exemplary embodiment shown, first wall 4 defines a top wall, second wall 6 defines a bottom wall, and third wall 8 defines a rear wall. Rear wall 8 may take the form of a door 10 having a handle or knob 12. At this point, it should be understood that electrical enclosure 2 may also include side walls (not shown). Electrical enclosure 2 includes a circuit breaker portion 16 and a line portion 18 defined, at least in part, by one or more of the top wall 4, bottom wall 6, rear wall 8, and side walls.

Circuit breaker portion 16 includes a first circuit breaker compartment 20 and a second circuit breaker compartment 22. Second circuit breaker compartment 22 is arranged between first circuit breaker compartment 20 and top wall 4. An auxiliary compartment 24 is arranged between first and second circuit breaker compartments 20 and 22. Auxiliary compartment 24 may house various controls, relays, communication devices, indicators, and the like. First circuit breaker compartment 20 includes a first door 28 and second circuit breaker compartment 22 includes a second door 30.

In the exemplary embodiment shown, a circuit breaker 32 projects through second door 30, as will be detailed more fully below. A third door 34 is provided across auxiliary compartment 24. Line portion 18 includes a line compartment 40 that may house bus bars 42 that provide line current to electrical enclosure 2, neutral bars (not shown) that provide a neutral connection, and load connectors (also not shown) that provide a connection between circuit breaker 32 and an electrical load (also not shown).

In accordance with an exemplary embodiment, electrical enclosure 2 includes an exhaust duct 50 extending substantially vertically from about bottom wall 6 to top wall 4 and between circuit breaker portion 16 and line portion 18. In accordance with an aspect of an exemplary embodiment, exhaust duct 50 extends substantially vertically through electrical enclosure 2 between circuit breaker portion 16 and bus bars 42. At this point, it should be understood that the phrase "substantially vertically" does not require that exhaust duct 50 extend perpendicularly relative to bottom wall 6. That is, exhaust duct 50 may extend at an angle relative to bottom wall 6. As will be detailed more fully below, exhaust duct 50 carries gases that may develop during an arc fault event from electrical enclosure 2.

In further accordance with an exemplary embodiment, a first passage or opening 54 fluidically connects first circuit breaker compartment 20 and exhaust duct 50 and a second passage or opening 56 fluidically connects second circuit breaker compartment 22 and exhaust duct 50. A third opening or outlet 58 is arranged at top wall 4. Third opening 58 fluidically connects exhaust duct 50 with a plenum 60 arranged on top wall 4. In addition, third opening 58 fluidically connects line compartment 40 with plenum 60. Plenum 60 may fluidically link with additional electrical enclosures (not shown). A wire mesh 62 extends across third opening 58. Wire mesh 62 allows exhaust gases to pass into plenum 60 and be exhausted through an exhaust opening 66. Plenum 60 directs exhaust gases through an external plenum (not shown) to avoid contact between exhaust gases and personnel that may be present near doors 28 and 30.

In further accordance with an exemplary embodiment, electrical enclosure 2 includes a first passage 70 extending between line portion 18 and first circuit breaker compartment 20 through exhaust duct 50. A second passage 71 also extends between line portion 18 and first circuit breaker compartment 20 through exhaust duct 50. First passage 70 may take the form of a first run-in passage 73 that provides a pathway for one or more conductors (not shown) electrically connecting bus bars 42 and a circuit breaker (also not shown) in first circuit breaker compartment 20. Second passage 71 may take the form of a first run-out passage 74 that provides a pathway for conductors (not shown) electrically connecting the circuit breaker 32 in first circuit breaker compartment 20 and load connectors in line compartment 40.

Similarly, a third passage 77 extends between line portion 18 and second circuit breaker compartment 22 through exhaust duct 50. A fourth passage 78 also extends between line portion 18 and second circuit breaker compartment 22 through exhaust duct 50. Third passage 77 may take the form of a second run-in passage 80 and fourth passage 78 may take the form of a second run-out passage 81. Second run-in passage 80 provides a pathway for one or more conductors 84 electrically connecting bus bars 42 and circuit breaker 32. Second run-out passage 81 provides a pathway for conductors 85 electrically connecting circuit breaker 32 and load connectors in line compartment 40. First, second, third, and fourth passages 70, 71, 77 and 78 are fluidically isolated from gases that may flow through exhaust duct 50.

In accordance with yet another aspect of an exemplary embodiment, electrical enclosure 2 includes a first ventilation opening 90 arranged in rear wall 8. A second ventilation opening 92 is arranged in rear wall 8 between first ventilation opening 90 and top wall 4. Of course, it should be understood, that the location of first and second ventilation openings 90 and 92 may vary. Ventilation openings 90 and 92 provide a pathway for venting gases from line portion 18. That is, during normal operation, heat may be generated in line portion 18, a cooling flow may pass through electrical enclosure 2 carrying the heat outward through ventilation openings 90 and 92.

Figure 2:
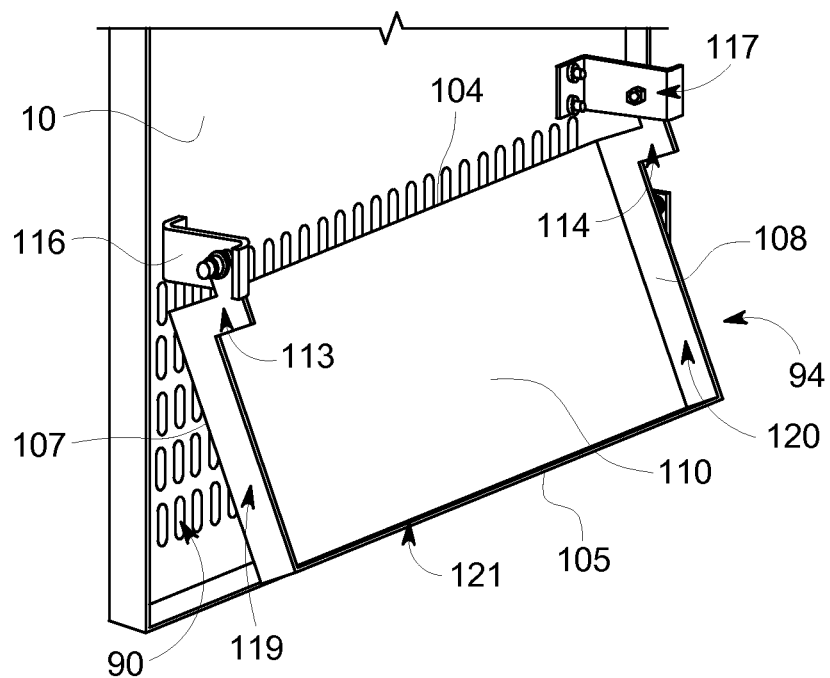
FIG. 2 depicts a first ventilation opening and corresponding first closure in the line portion of the electrical enclosure of FIG. 1.
Figure 3:
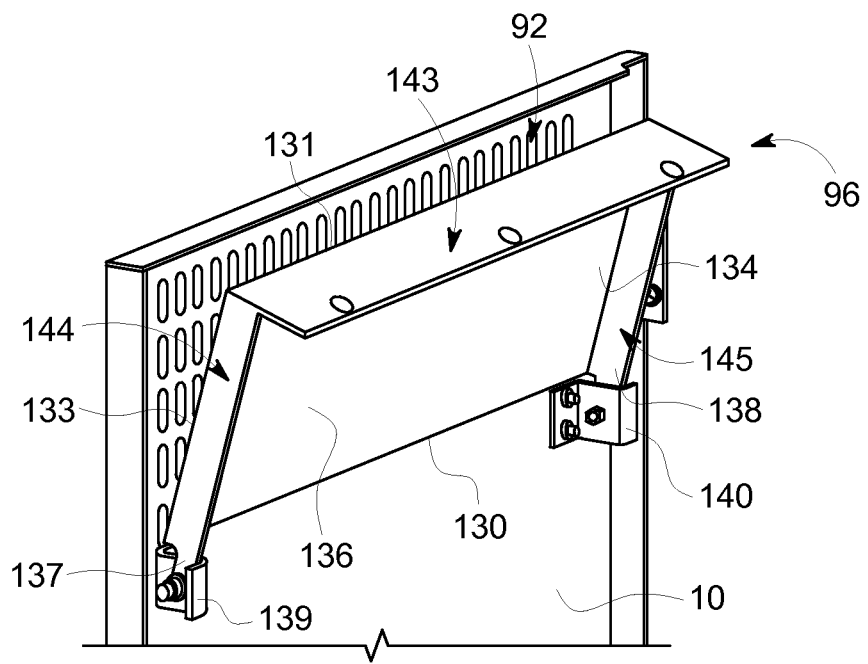
FIG. 3 depicts a second ventilation opening and corresponding second closure in the line portion of the electrical enclosure of FIG. 1.
Figure 4:
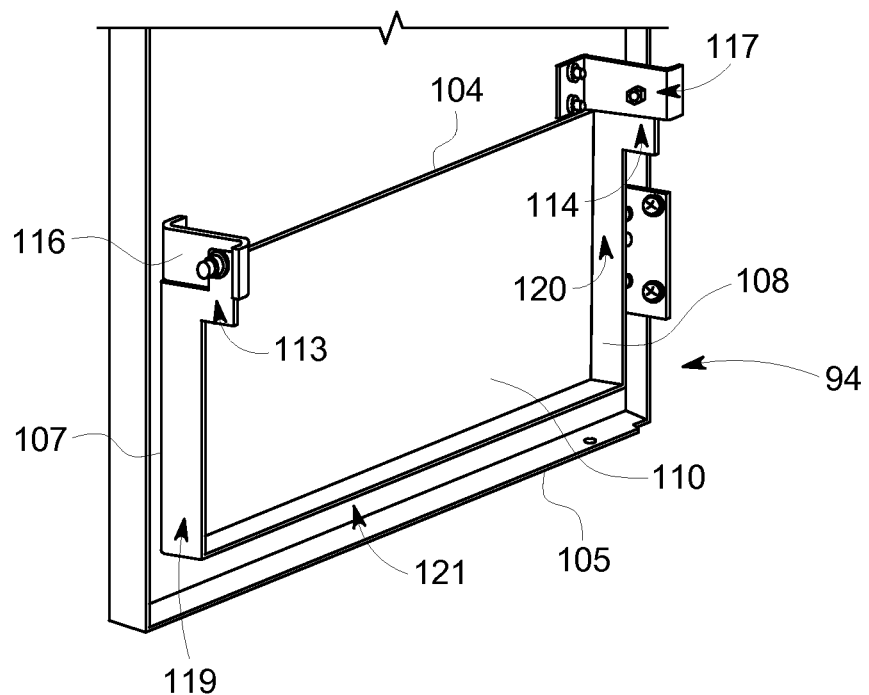
FIG. 4 depicts the first closure covering the ventilation opening in response to a pressure wave in the line portion.
Figure 5:
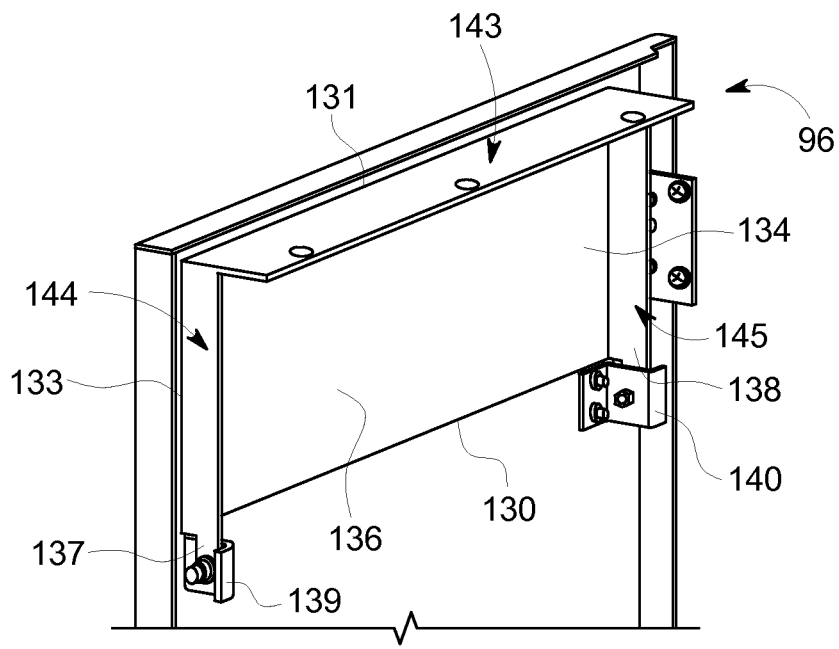
FIG. 5 depicts the second closure covering the ventilation opening in response to a pressure wave in the line portion.

A first closure 94 is provided at first ventilation opening 90 and a second closure 96 is provided at second ventilation opening 92. As will be detailed more fully below, first closure 94 is shiftable between an open configuration, such as shown in FIG. 2, and a closed configuration as shown in FIG. 4. Likewise, second closure 96 is shiftable between an open configuration, such as shown in FIG. 3, and a closed configuration such as shown in FIG. 5. First and second closures 94 and 96 are in a normally open position providing a ventilation pathway for line compartment 40. First and second closures 94 and 96 may shift to the closed configuration in response to a pressure wave in line compartment 40 that may be the result of an arc fault or other condition. In the closed configuration, the pressure wave is directed upwardly into plenum 60. Once the pressure wave has passed, or at least a peak value of the pressure wave has passed, first and second closures 94 and 96 re-open in response to gravity. That is, in accordance with an aspect of an exemplary embodiment, without the force of the pressure wave, first and second ventilation openings 90 and 92 are re-opened solely due to gravity acting on first and second closures 94 and 96.

As shown in FIG. 2, first closure 94 extends from a first end 104 to a second end 105 and includes a first side portion 107 and an opposing, second side portion 108. A substantially planar surface 110 extends between first and second ends 104 and 105 and first and second side portions 107 and 108. A first mounting bracket 113 is provided at first side portion 107 at first end 104. Similarly, a second mounting bracket 114 is provided at second side portion 108 at first end 104. First mounting bracket 113 is pivotally secured to a first support 116 and second mounting bracket 114 is pivotally secured to a second support 117. First and second mounting brackets 113 and 114 together with first and second supports 116 and 117 shift a center of gravity of first closure 94 towards first end 104. In this manner, when acted upon solely by gravity, first closure 94 naturally resides in the open configuration depicted in FIG. 2. At this point, it should be understood that while shown as being L-shaped, the particular geometry of mounting brackets 113 and 114 may vary.

First closure 94 also includes a first wall member 119 extending substantially perpendicularly outwardly along second end 105, a second wall member 120 extending substantially perpendicularly outwardly along first side portion 107, and a third wall member 121 extending substantially perpendicularly outwardly along second side portion 108. First, second, and third wall members 119-121 collectively define a bucket or box (not separately labeled) that enhances a closing response of first closure 94 when contacted by a pressure wave.

As shown in FIG. 3, second closure 96 extends from a first end 130 to a second end 131 and includes a first side portion 133 and an opposing, second side portion 134. A substantially planar surface 136 extends between first and second ends 130 and 131 and first and second side portions 133 and 134. A first mounting ear 137 is provided at first side portion 133 at first end 130. Similarly, a second mounting ear 138 is provided at second side portion 134 at first end 130. First mounting ear 137 is pivotally secured to a first support 139 and second mounting ear 138 is pivotally secured to a second support 140.

Second closure 96 also includes a first wall member 143 extending substantially perpendicularly outwardly along second end 131, a second wall member 144 extending substantially perpendicularly outwardly along first side portion 133, and a third wall member 145 extending substantially perpendicularly outwardly along second side portion 134. First, second, and third wall members 143-145 collectively define a bucket or box (not separately labeled) that enhances a closing response of second closure 96 when contacted by a pressure wave. In addition, first wall member 143 includes a length that is greater than second and third wall members 144 and 145. Accordingly, first wall member 143 shifts a center of gravity of second closure 96 toward second end 131. In this manner, when acted upon solely by gravity, second closure 96 naturally resides in the open configuration depicted in FIG. 3.

Figure 6:
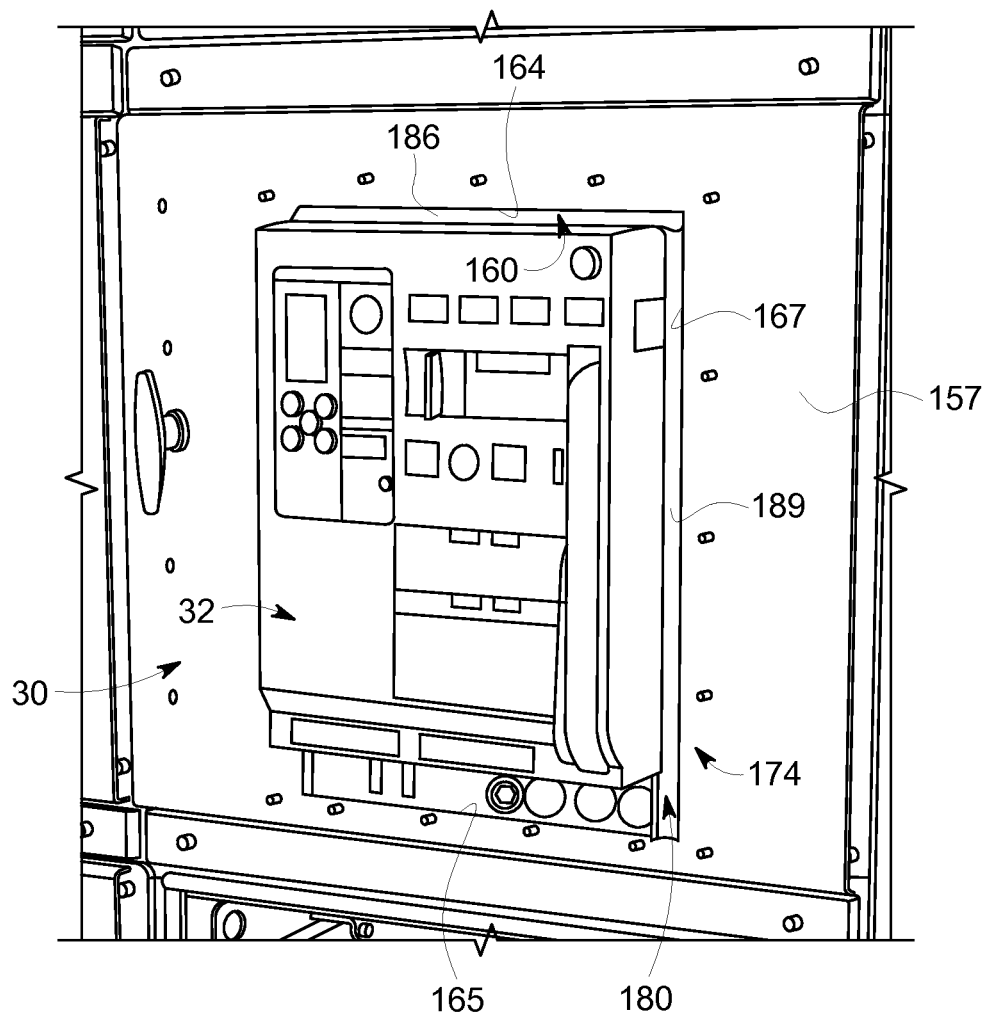
FIG. 6 depicts a door having an escutcheon of the electrical enclosure of FIG. 1.
Figure 7:
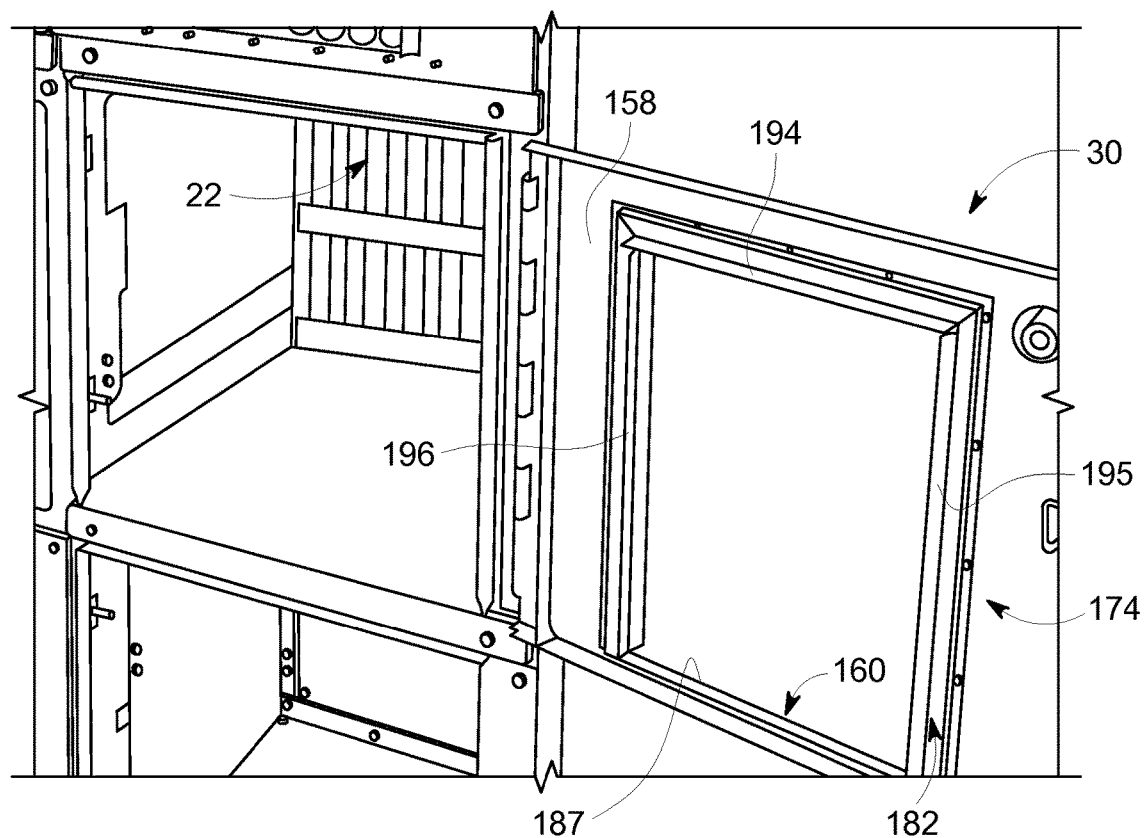
FIG. 7 depicts the door of FIG. 6 in an open configuration.
Figure 8:
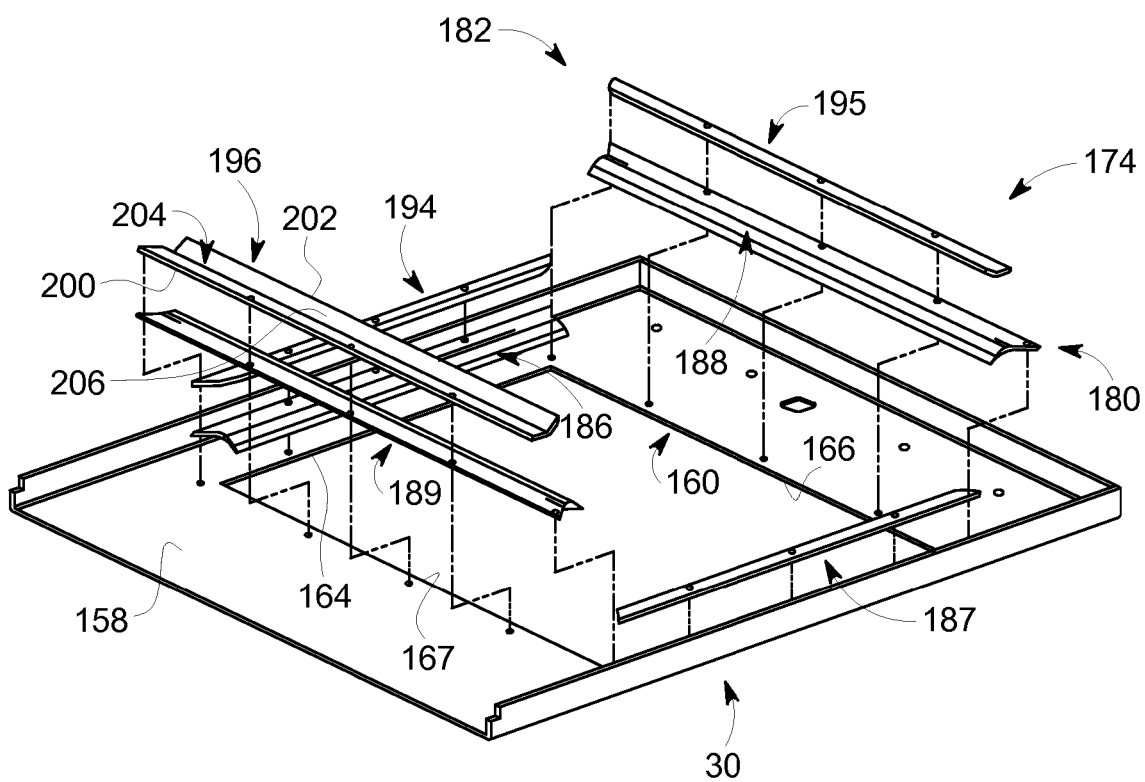
FIG. 8 depicts a partially exploded view of the door and escutcheon of FIG. 6.

Reference will now follow to FIGS. 6-8 in describing second door 30 in accordance with yet another aspect of an exemplary embodiment. It should however be understood that first door 28 may include similar structure. Second door 30 includes an outer surface 157 and an inner surface 158. An opening 160 receptive of circuit breaker 32 is formed in second door 30. Opening 160 includes a first edge portion 164, an opposing, second edge portion 165, a third edge portion 166 extending between first and second edge portions 164 and 165, and a fourth edge portion 167 extending between first and second edge portions 164 and 165 opposite third edge portion 166. An escutcheon 174 extends about opening 160 to provide a seal between ambient and second circuit breaker compartment 22.

In accordance with an aspect of an exemplary embodiment, escutcheon 174 includes an outer seal assembly 180 and an inner seal assembly 182. Outer seal assembly 180 includes a first outer seal member 186, a second outer seal member 187, a third outer seal member 188, and a fourth outer seal member 189. First outer seal member 186 is secured to inner surface 158 along first edge portion 164. Second outer seal member 187 is secured to inner surface 158 along second edge portion 165. Third outer seal member 188 is secured to inner surface 158 along third edge portion 166, and fourth outer seal member 189 is secured to inner surface 158 along fourth edge portion 167. First, second, third, and fourth outer seal members 186-189 directly engage an outer surface (not separately labeled) of circuit breaker 32 when second door 30 is in a closed configuration, as shown in FIG. 6. In this manner, outer seal assembly 180 inhibits ingress of foreign objects to second circuit breaker compartment 22.

Inner seal assembly 182 is arranged to selectively engage the outer surface of circuit breaker 32. More specifically, inner seal assembly 182 includes a first inner seal member 194, a second inner seal member 195, and a third inner seal member 196. In accordance with an aspect of an exemplary embodiment first inner seal member 194 is mounted to inner surface 158 along first edge portion 164 through first outer seal member 186. Second inner seal member 195 is mounted to inner surface 158 along second edge portion 165 through second outer seal member 187, and third inner seal member 196 is mounted to inner surface 158 along third edge portion 166 through third outer seal member 188. In the exemplary embodiment shown, fourth edge portion 167 is devoid of an inner seal member in order to accommodate additional structure (not separately labeled) arranged below circuit breaker 32. Of course, it should be understood, that a fourth inner seal member could be added in other configurations.

In a normal, non-deployed configuration, first, second, and third inner seal members 194-196 are spaced from the outer surface of circuit breaker 32. In this manner, second door 30 may freely transition between open and closed configurations without inner seal assembly 182 providing an impediment. In a deployed configuration, first, second, and third inner seal members 194-196 directly engage the outer surface of circuit breaker 32. More specifically, inner seal members 194-196 are responsive to a pressure wave in second circuit breaker compartment 22 to flex outwardly to engage the outer surface of circuit breaker 32. In this manner, inner seal assembly 182 inhibits passage of gases, solids, and/or semi-solids such as molten metal passing from second circuit breaker compartment 22 during an arc fault condition.

Reference will now follow to FIG. 8 in describing third inner seal member 196 with an understanding that first and second inner seal members 194 and 195 may include similar structure. Third inner seal member 196 includes a first end 200, and a second, cantilevered end 202. An intermediate portion 204 extends between first and second ends 200 and 202. First end 200 is secured to inner surface 158 through third outer seal member 188. Second, cantilevered end 202 flexes, or deforms, into engagement with the outer surface of circuit breaker 32 in response to a pressure wave in second circuit breaker portion 22. In order to enhance responsiveness to the pressure wave, intermediate portion 204 includes a curvilinear surface 206. Curvilinear surface 206 defines a pressure wave receiving surface (not separately labeled) that cups the pressure wave causing second end 202 to flex outwardly into contact with the outer surface of circuit breaker 32 thereby inhibiting flow from second circuit breaker compartment 22.

At this point, it should be understood that the exemplary embodiments describe systems that contain and direct gases and other debris that may be generated in an electrical enclosure due to, for example, an arc fault condition. More specifically, the exemplary embodiments direct gases that may form as a result of an arc fault condition along a predetermined path through the electrical enclosure. Various openings that could provide an outlet, such as doors and ventilation openings, are closed, and an exhaust path defined that guides gases upwardly, outwardly and rearwardly of the electrical enclosure. In this manner, the gases, and any debris that may be entrained within the gases, may be directed to a desired location avoiding contact with personnel that may be near the electrical enclosure during an arc fault event.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one more other features, integers, steps, operations, element components, and/or groups thereof.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electrical enclosure including a plurality of walls, the electrical enclosure comprising:
   at least one compartment defined, at least in part, by the plurality of walls;
   at least one ventilation opening formed in a first wall of the plurality of walls, the ventilation opening providing a flow path from the at least one compartment; and
   at least one closure provided on the first wall at the at least one ventilation opening, the at least one closure including a first end, a second end, and an intermediate portion extending between the first end and the second end, the first end being pivotally mounted to the first wall, the at least one closure being responsive to a pressure wave event to pivot at the first end to move the second end toward the first wall to selectively close the at least one ventilation opening, and responsive to gravity to pivot at the first end to move the second end away from the first wall to re-open the at least one ventilation opening after the pressure wave event solely due to gravity acting on the at least one closure.

2. The electrical enclosure according to claim 1, wherein the at least one closure includes a center of gravity established toward the second end, to re-open the at least one ventilation opening after the pressure wave event.

3. The electrical enclosure according to claim 1, wherein the at least one closure includes a first mounting bracket at the first end and a second mounting bracket at the first end, the at least one closure being pivotally mounted to the first wall through the first and second mounting brackets.

4. The electrical enclosure according to claim 1, wherein the at least one closure includes a first wall member extending substantially perpendicularly outwardly between the first and second ends, and a second wall member spaced from the first wall member and extending substantially perpendicularly outwardly between the first and second ends, and a third wall member extending substantially perpendicularly outwardly of the second end connecting the first and second wall members.

5. The electrical enclosure according to claim 4, wherein the third wall member has a length greater than each of the first and second wall members.

6. The electrical enclosure according to claim 4, wherein the first, second, and third wall members collectively define a box to enhance a closing response of the at least one closure in response to the pressure wave event.

7. The electrical enclosure according to claim 1, wherein the at least one ventilation opening includes a first ventilation opening and a second ventilation opening, the first and second ventilation openings each being arranged on the first wall of the electrical enclosure and spaced apart from one another.

8. The electrical enclosure according to claim 7, wherein the at least one closure includes a first closure arranged at the first ventilation opening and a second closure arranged at the second ventilation opening.

9. The electrical enclosure according to claim 8, wherein:
the first closure includes (i) a planar surface extending between the first and second ends of the first closure, (ii) a first wall member extending substantially perpendicularly outwardly from the planar surface of the first closure and extending between the first and second ends of the first closure, (iii) a second wall member spaced from the first wall member of the first closure, extending substantially perpendicularly outwardly from the planar surface of the first closure, and extending between the first and second ends of the first closure, and (iv) a third wall member extending substantially perpendicularly outwardly from the planar surface of the first closure along the second end of the first closure to connect the first and second wall members of the first closure, and
the second closure includes (i) a planar surface extending between the first and second ends of the second closure, (ii) a first wall member extending substantially perpendicularly outwardly from the planar surface of the second closure and extending between the first and second ends of the second closure, (iii) a second wall member spaced from the first wall member of the second closure, extending substantially perpendicularly outwardly from the planar surface of the second closure, and extending between the first and second ends of the second closure, and (iv) a third wall member extending substantially perpendicularly outwardly from the planar surface of the second closure along the second end of the second closure to connect the first and second wall members of the second closure.

10. The electrical enclosure according to claim 9, wherein:
the third wall member of the first closure extends substantially perpendicularly outwardly from the planar surface of the first closure a first length, each of the first and second wall members of the first closure extends substantially perpendicularly outwardly from the planar surface of the first closure a second length, the first length being equal to the second length, and
the third wall member of the second closure extends substantially perpendicularly outwardly from the planar surface of the second closure a third length, each of the first and second wall members of the second closure extends substantially perpendicularly outwardly from the planar surface of the second closure a fourth length, the third length being greater than the fourth length.

11. The electrical enclosure according to claim 9, wherein:
the first, second, and third wall members of the first closure collectively define a box to enhance a closing response of the first closure in response to the pressure wave event, and
the first, second, and third wall members of the second closure collectively define a box to enhance a closing response of the second closure in response to the pressure wave event.

12. The electrical enclosure according to claim 9, wherein the first closure includes a center of gravity established toward the first end to re-open the first ventilation opening after the pressure wave event, and wherein the second closure has a center of gravity established toward the second end to re-open the second ventilation opening after the pressure wave event.

13. The electrical enclosure according to claim 1, wherein the at least one closure includes a center of gravity established toward the first end to re-open the at least one ventilation opening after the pressure wave event.

14. The electrical enclosure according to claim 1, wherein the at least one closure includes a center of gravity established toward the second end to re-open the at least one ventilation opening after the pressure wave event.

15. The electrical enclosure according to claim 1, wherein the at least one closure is configured such that a portion of the first end moves away from the first wall when the second end moves away from the first wall.

* * * * *